(12) United States Patent
Subedi

(10) Patent No.: US 9,467,116 B2
(45) Date of Patent: Oct. 11, 2016

(54) BROAD BAND DIPLEXER USING SUSPENDED STRIP-LINE CAPACITOR TECHNOLOGY

(71) Applicant: Intel Corporation, Santa Clara, CA (US)

(72) Inventor: Purna Subedi, Irvine, CA (US)

(73) Assignee: Intel Corporation, Santa Clara, CA (US)

(*) Notice: Subject to any disclaimer, the term of this patent is extended or adjusted under 35 U.S.C. 154(b) by 231 days.

(21) Appl. No.: 13/715,634

(22) Filed: Dec. 14, 2012

(65) Prior Publication Data

US 2013/0285765 A1 Oct. 31, 2013

Related U.S. Application Data

(60) Provisional application No. 61/577,455, filed on Dec. 19, 2011.

(51) Int. Cl.
| | |
|---|---|
| *H01P 1/213* | (2006.01) |
| *H01P 1/203* | (2006.01) |
| *H03H 9/46* | (2006.01) |
| *H01P 5/18* | (2006.01) |

(52) U.S. Cl.
CPC .............. *H03H 9/46* (2013.01); *H01P 1/2135* (2013.01); *H01P 1/203* (2013.01); *H01P 5/187* (2013.01)

(58) Field of Classification Search
CPC ... H01P 1/203; H01P 1/20381; H01P 1/2135
USPC ........................ 333/204, 205, 219
See application file for complete search history.

(56) References Cited

U.S. PATENT DOCUMENTS

| | | | | |
|---|---|---|---|---|
| 4,731,596 | A * | 3/1988 | Cruchon et al. ............. | 333/204 |
| 4,849,722 | A * | 7/1989 | Cruchon et al. ............. | 333/205 |
| 6,835,968 | B2 * | 12/2004 | Kitazawa et al. ........... | 257/107 |
| 8,049,578 | B1 * | 11/2011 | Albers et al. ............... | 333/134 |
| 2004/0246071 | A1 * | 12/2004 | Rottmoser et al. .......... | 333/134 |

* cited by examiner

*Primary Examiner* — Robert Pascal
*Assistant Examiner* — Gerald Stevens
(74) *Attorney, Agent, or Firm* — Schwegman Lundberg & Woessner, P.A.

(57) ABSTRACT

A broad band diplexer employing suspended strip-line capacitors is disclosed. The diplexer has a low pass filter circuit and a high band pass filter circuit. The high band pass filter circuit has a first set of conductive pathways formed on the first surface of a suspended dielectric substrate, a second conductive pathway formed on the second surface of the substrate such that first and second conductive pathways are capacitively coupled, and plural resonators. The high pass filter circuit provides plural transmission poles within the band of operation exceeding the number of resonators.

18 Claims, 13 Drawing Sheets

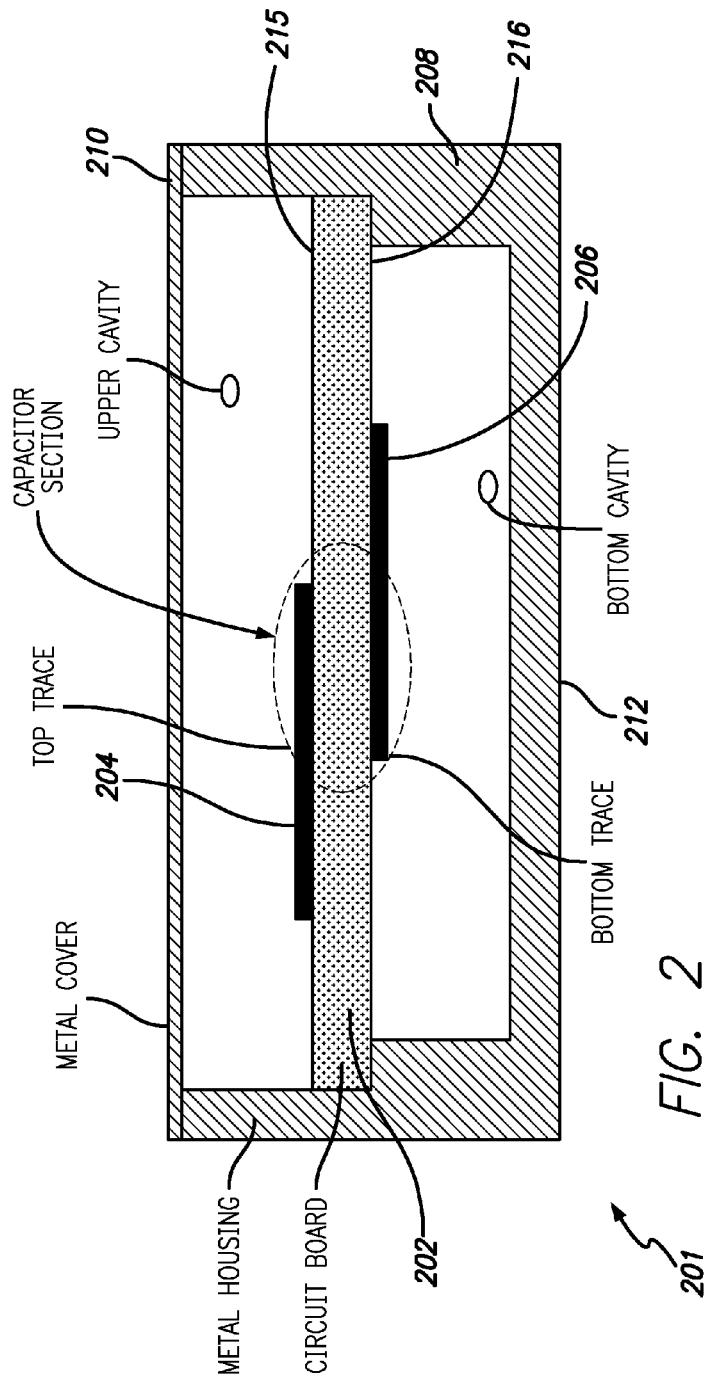
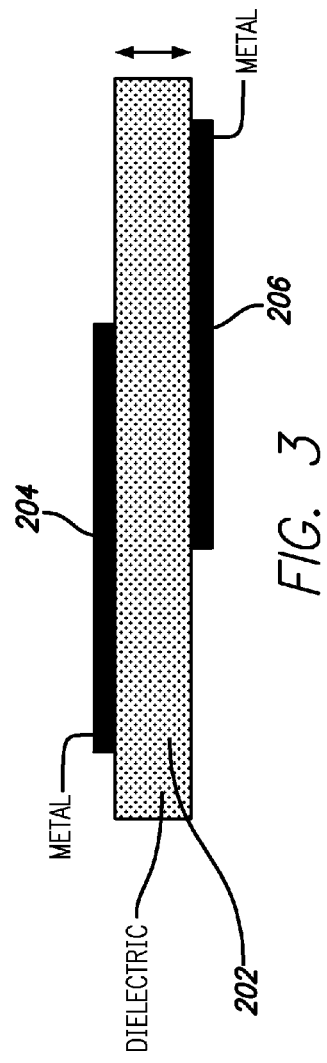

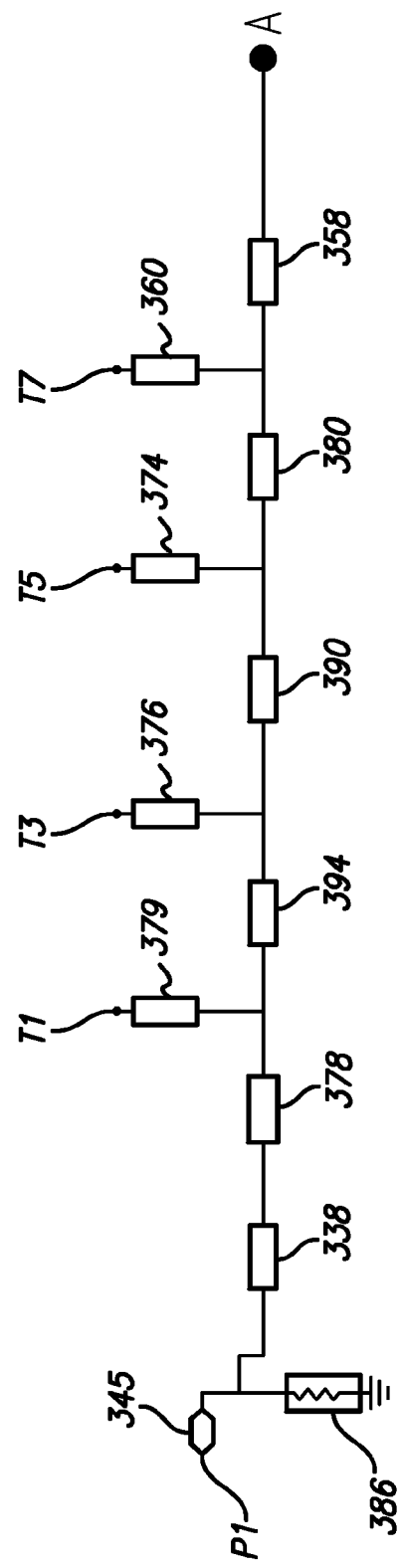

BROAD BAND DIPLEXER USING SUSPENDED STRIP-LINE CAPACITOR TECHNOLOGY

RELATED APPLICATION INFORMATION

The present application claims priority under 35 U.S.C. Section 119(e) to U.S. Provisional Patent Application Ser. No. 61/577,455 filed Dec. 19, 2011, the disclosure of which is incorporated herein by reference in its entirety.

BACKGROUND OF THE INVENTION

1. Field of the Invention

The present invention relates in general to communication systems and components. More particularly, the present invention is directed to RF filters and multiplexers.

2. Description of the Prior Art and Related Background Information

The desire for smaller, lighter, and higher performing electrical filters and diplexers increases as base station functionalities decrease in size and/or are placed in tower tops such as remote radio-heads, antennas with integrated filters, active antenna arrays, or tower mounted amplifiers for the cellular communication systems. Diplexers are used when two frequency bands are combined (or divided in reverse usage). Traditionally, diplexers are made from a number of techniques such as using two bandpass filters in which each filter may be constructed using a variety of techniques depending on the desired performance and both of these filters are joined to a common junction such that operation of each filter remains independent from the other which is also commonly known as phasing. With one common port, two filters separated in bands of frequencies are called a duplexer or a diplexer, three filters separated by bands of frequencies are called a triplexer, four filters separated by bands of frequencies are called a quadruplexer, and the like. More generally, a plurality of filters sharing a common port is called a multiplexer. In some cases, one or all of the filters may consist of a low pass filter, band stop filter, high pass filter, or band pass filter. Generally, diplexing becomes technically challenging as the bandwidths of diplexed filters get wider. Normally, when two filters are combined to form a diplexer in the frequency range below 3 GHz, the filters employed typically have a 3 MHz to 200 MHz bandwidth.

Accordingly, there is a need to provide wide bandwidth diplexers and multiplexers. Also, it is desirable to provide such wide bandwidth diplexers and multiplexers with minimal increased size and cost.

SUMMARY OF THE INVENTION

In a first aspect, the present invention provides a diplexer. The diplexer comprises a top ground plate and a bottom ground plate spaced apart to form one or more cavities, at least one dielectric substrate suspended between the top and bottom ground plates, a common port coupled to the at least one substrate, a low frequency port coupled to the at least one substrate, and a high frequency port coupled to the at least one substrate. A low pass filter section comprises a first transmission line structure, formed on the substrate and electrically connecting the low frequency port and the common port, and one or more low frequency resonator structures formed on the substrate and coupled to the first transmission line structure. A high pass filter section comprises a second transmission line structure formed on a first surface of the at least one substrate, and a third transmission line structure formed on a second surface of the substrate and having at least one portion overlapping and immediately opposite a corresponding portion of the second transmission line structure and capacitively coupled thereto, the second and third transmission line structures together electrically connecting the high frequency port and the common port. The high pass filter section further comprises one or more high frequency resonator structures formed on the substrate and coupled to at least one of the second and third transmission line structures.

In an embodiment, the one or more high frequency resonator structures preferably comprise plural strip-line resonators alternating on opposite sides of the substrate. The plural resonators may comprise a first resonator formed on the second surface of the substrate, the first resonator electrically coupled to the third transmission line structure, a second resonator formed on the first surface of the substrate, the second resonator electrically coupled to the second transmission line structure, and a third resonator formed on the second surface, the third resonator electrically coupled to the third transmission line structure. The high pass filter section may operate within the frequency range of approximately 1400 MHz to approximately 4000 MHz. The high pass filter section may exhibit 9 to 11 transmission poles within the band of operation. The first transmission line structure and the one or more low frequency resonator structures may be formed on a single surface of the at least one substrate. The one or more low frequency resonator structures may comprise four strip-line resonators. The low pass filter section may operate within the frequency range of approximately 0 MHz to approximately 1200 MHz. The dielectric substrate preferably comprises a printed circuit board.

In another aspect, the present invention provides a multiplexer. The multiplexer comprises a first ground plane, a second ground plane spaced away from and generally parallel with the first ground plane, a dielectric substrate having a first surface and a second surface, the substrate suspended between the first and second ground planes, a common port coupled to the suspended substrate, one or more low frequency ports, one or more low frequency filter structures interconnecting the common port and the one or more low frequency ports, and one or more high frequency filter structures. The one or more high frequency filter structures each preferably comprise a high frequency port coupled to the suspended substrate, a first split conductive path having gaps therein and partially physically interconnecting the high frequency port and the common port and formed on the first surface of the suspended substrate, and a second split conductive path having gaps therein formed on the second surface of the suspended substrate, wherein the second conductive path overlaps the gaps in the first conductive path and overlaps and is capacitively coupled to the first conductive path at portions adjacent the gaps. The high frequency filter structures further comprise one or more high frequency resonators formed on the substrate and in electrical shunt with an adjacent conductive path.

In a preferred embodiment, each low frequency filter structure preferably comprises a low frequency signal path interconnecting the low frequency port and the common port and one or more low frequency strip-line resonators connected in electrical shunt with the low frequency signal path. The one or more high frequency resonators preferably comprise plural strip-line resonators alternating between the first and second surfaces of the suspended substrate.

In another aspect, the present invention provides a wideband filter comprising a dielectric substrate having a first surface and a second surface. The filter further comprises a first port coupled to the dielectric substrate, a second port coupled to the dielectric substrate, and a first conductive pathway having plural separate sections formed on the first surface of the substrate between the first and second ports, the first port electrically coupled to a section of the first conductive pathway nearest the first port and the second port electrically coupled to the section of the first conductive pathway nearest the second port. The filter further comprises a second conductive pathway having one or more separate sections formed on the second surface of the dielectric substrate, the second conductive pathway having at least one portion overlapping and immediately opposite a corresponding gap in the sections of the first conductive pathway, and overlapping adjacent portions of the first conductive pathway and capacitively coupled thereto. The filter further comprises one or more resonator structures formed on the substrate and coupled to at least one of the first and second conductive pathways.

In a preferred embodiment, the wideband filter further comprises a metal housing enclosing the dielectric substrate, the metal housing having a first ground plane spaced away from the first surface of the substrate, the metal housing having a second ground plane spaced away from the second surface of the substrate, wherein the substrate is suspended between the two ground planes. The one or more resonator structures may comprise a first strip-line resonator formed on the second surface of the substrate, the first strip-line resonator electrically coupled to the second conductive pathway, a second strip-line resonator formed on the first surface of the substrate, the second strip-line resonator electrically coupled to the first conductive pathway, and a third strip-line resonator formed on the second surface of the substrate, the third strip-line resonator electrically coupled to the second conductive pathway. The first conductive pathway preferably comprises at least four separate sections and two gaps, and the second conductive pathway preferably comprises at least two separate sections overlapping the two gaps and adjacent portions of the first conductive pathway. The filter may exhibit more transmission poles within the band of operation than the number of resonators and preferably comprises three resonators and may exhibit 9 to 11 transmission poles within the band of operation. The filter may operate within the frequency range of approximately 1400 MHz to approximately 4000 MHz. The dielectric substrate preferably comprises a printed circuit board.

Further features and aspects of the invention are set out in the following detailed description.

BRIEF DESCRIPTION OF THE DRAWINGS

FIG. 2 is a representation of a cross sectional view of the high pass section.

FIG. 3 is a representation of a cross sectional view of the illustrating details of the dielectric, and the top and bottom traces which form the capacitors in the high pass section.

FIG. 4a illustrates an equivalent circuit for a computer simulation in section 1 of FIG. 4.

DETAILED DESCRIPTION OF THE INVENTION

In one aspect of one or more embodiments, a low pass filter section (P1 to C0) with a bandwidth of approximately 1200 MHz (0-1200 MHz bandwidth) is diplexed with another filter section that is operating in the frequency range from approximately 1400 MHz to 4000 MHz (P2 to C0). This technique also works in making diplexers that are much closer in bandwidth. Using this technique, one or more embodiments have been completed where the lower side of the band is passed up to 806 MHz and the higher side of the band is passed from 824 to 1200 MHz with very low insertion loss.

In the high pass filter section (P2 to C0), the coupling capacitors are realized with two overlapping microstrip conductors (C1 to C4) utilizing suspended substrate topology. While doing so, the geometry lends itself such that extra resonances are achieved in band for each open circuited leg and these lengths can be optimized for various bandwidths. The advantage of this extra resonance is that much steeper selectivity is achieved while only incurring the cost for much fewer resonators. For example, a very broadband band pass filter which can be used as a high pass filter (P2 to C0) for a specific frequency range (1400-4000 MHz in this example), is designed to provide only three poles, but the effect is equivalent to 9 to 11 transmission poles that can be designed to fall within the desired band of operation and yet the insertion loss and size is not increased proportionally. The resulting size reduction for similar performance from the other traditional filters such as combline and ceramic loaded is significant. Additionally these PC boards can easily be integrated inside other components such as antennas, radio heads, and other radio devices.

Although the terms "low pass" filter and "high pass" filter are used herein for describing the illustrated embodiments, the terms may cover any of the known filter types including in addition the above noted filter types (pass band and band stop). Also, the terms low and high are not limited to a particular frequency but refer to one frequency range being lower or higher than another.

Figure 1:
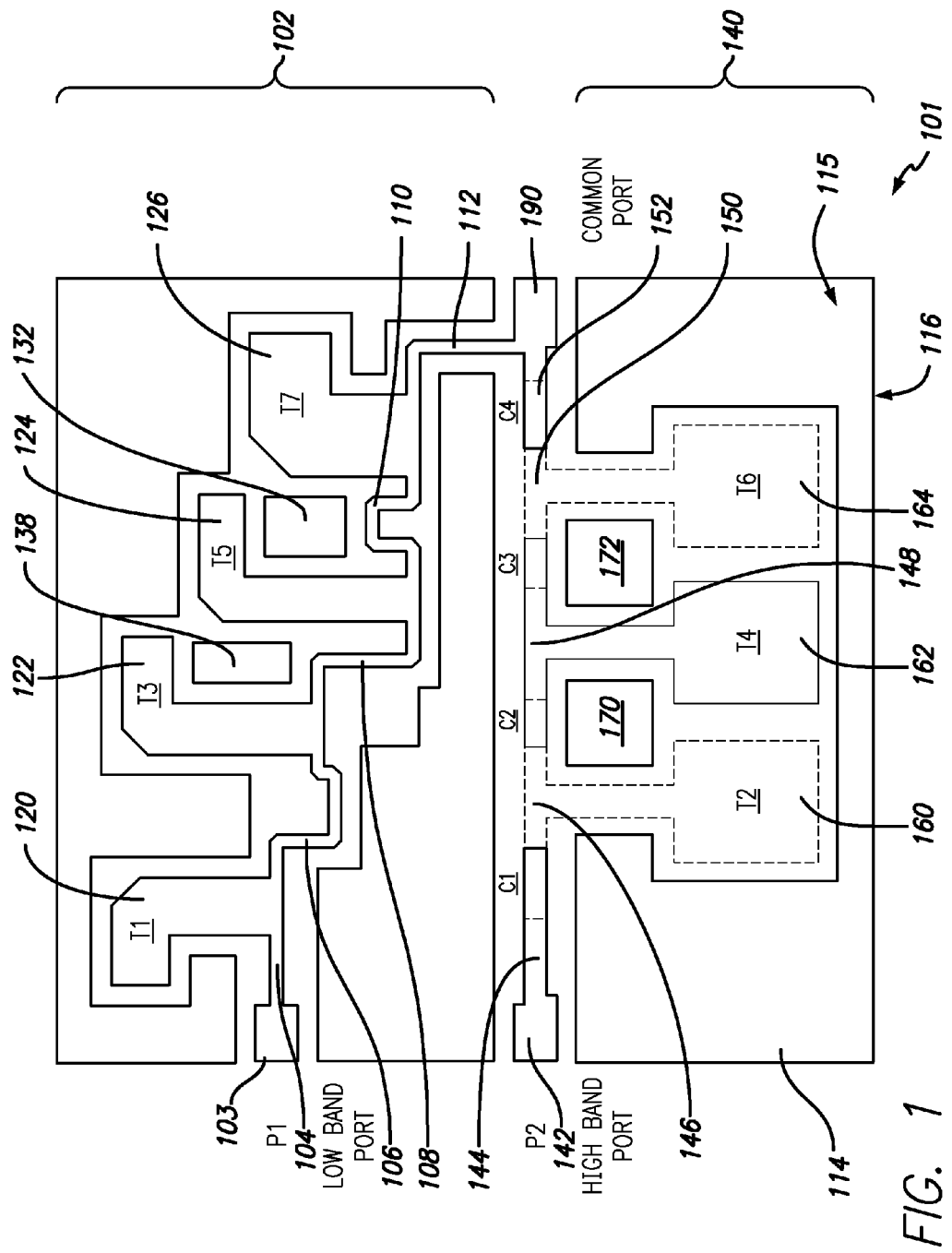
FIG. 1 is a top view of a diplexer circuit having a low band port, a high band port, and a common port in an embodiment.
Figure 4:
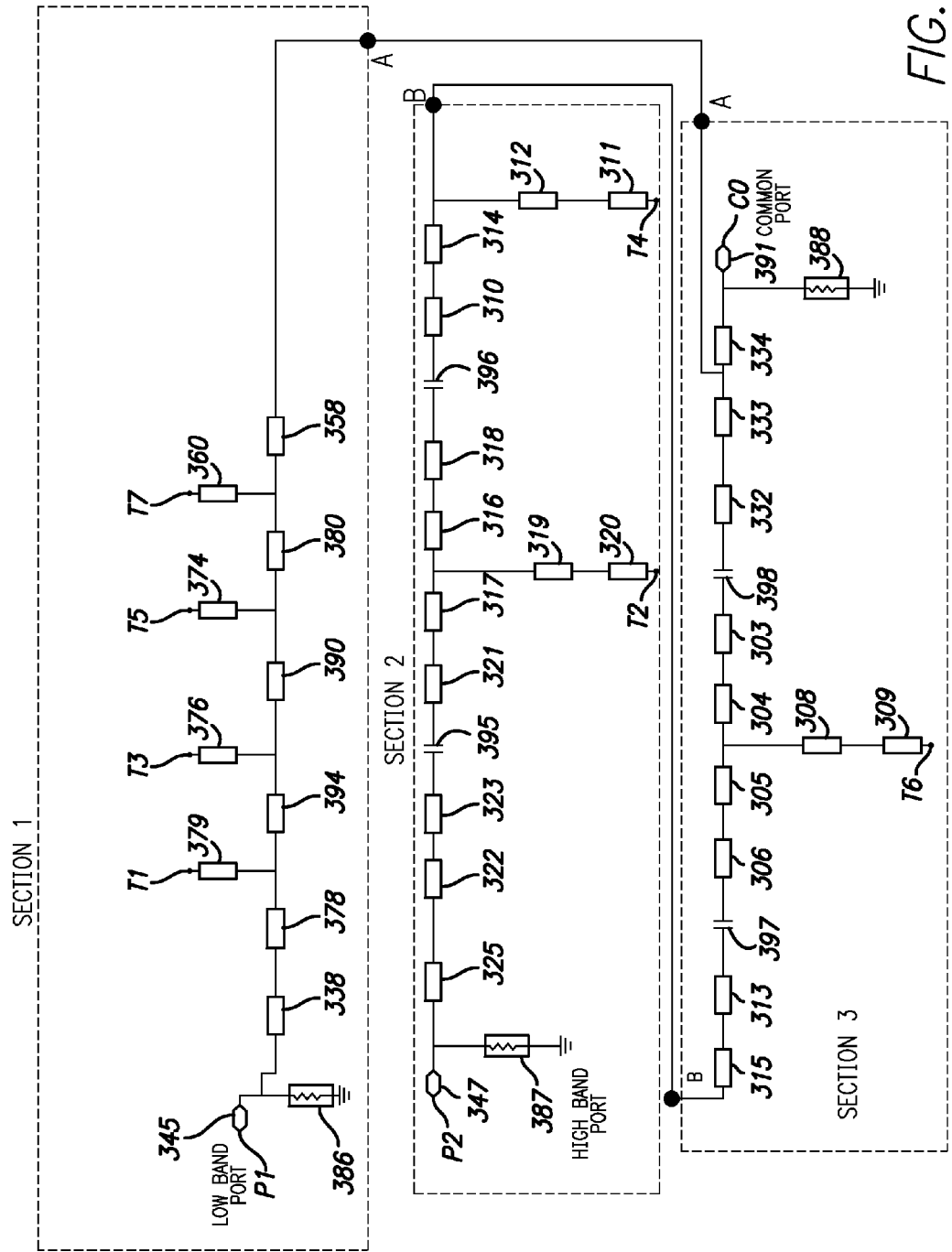
FIG. 4 illustrates an equivalent circuit for performing a computer simulation of a diplexer employing suspended substrate transmission lines and capacitors.
Figure 4B:
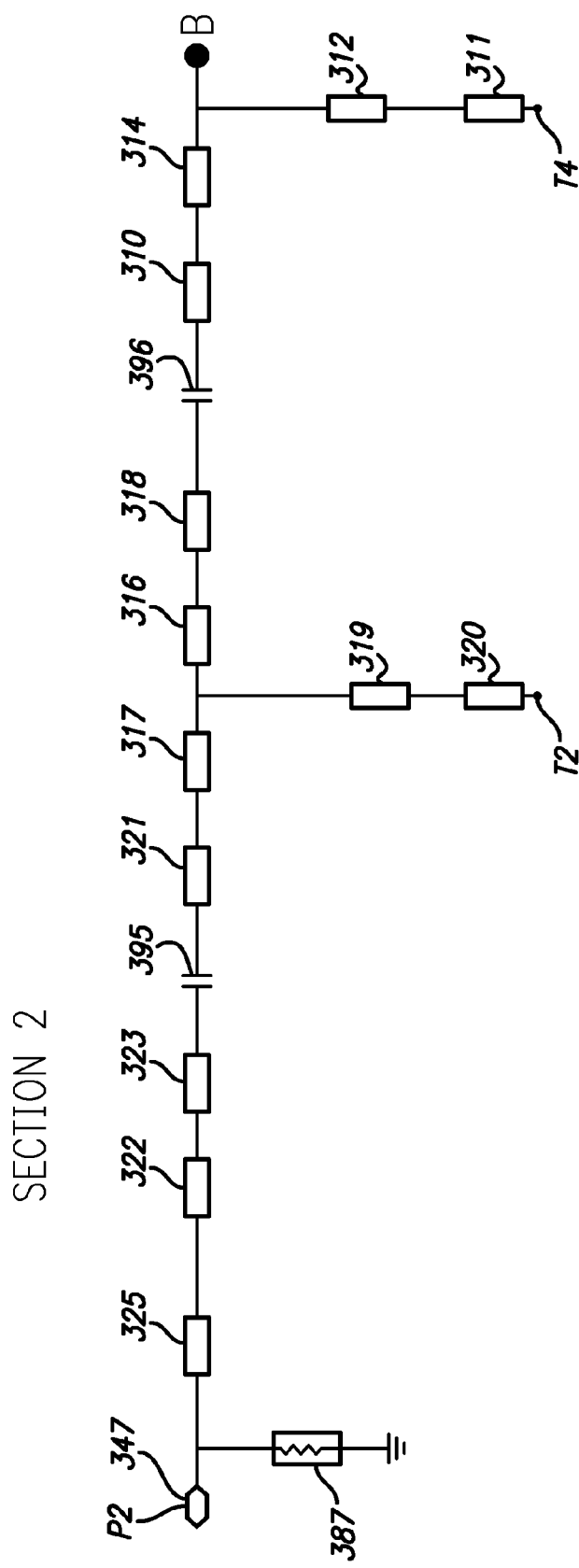
FIG. 4b illustrates an equivalent circuit for a computer simulation in section 2 of FIG. 4.
Figure 4C:
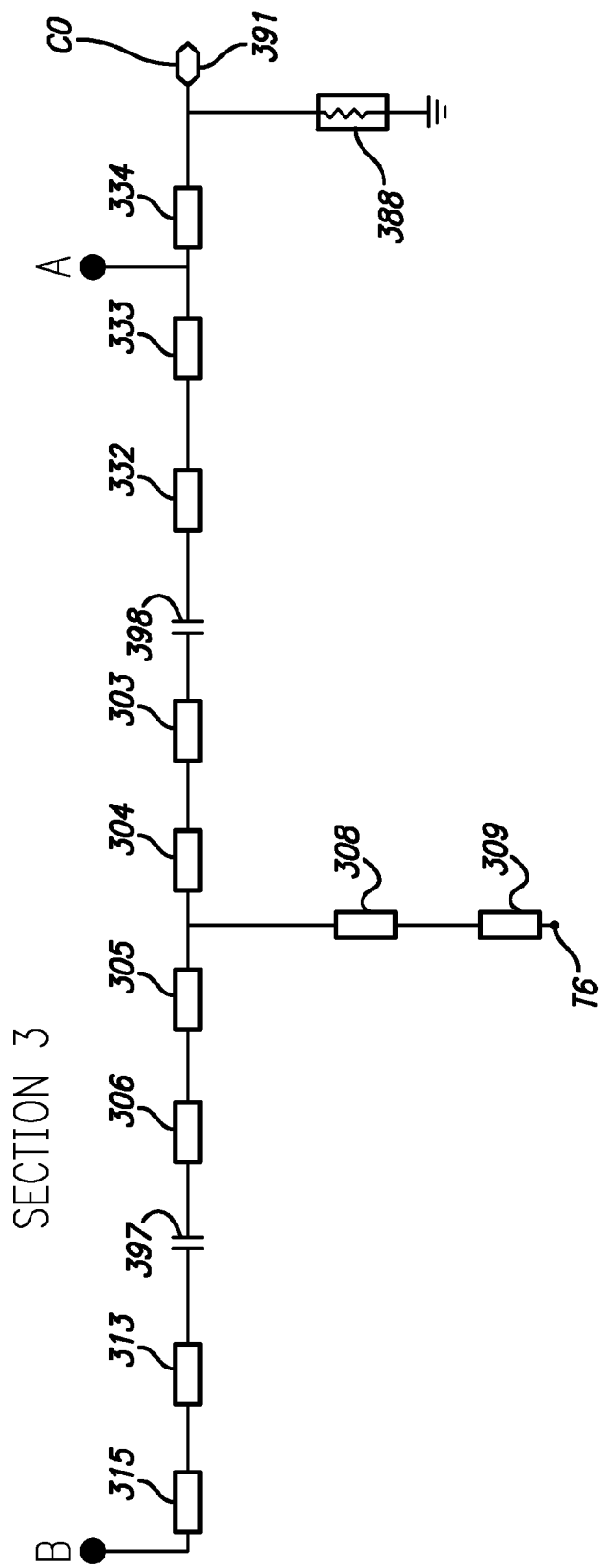
FIG. 4c illustrates an equivalent circuit for a computer simulation in section 3 of FIG. 4.
Figure 11:
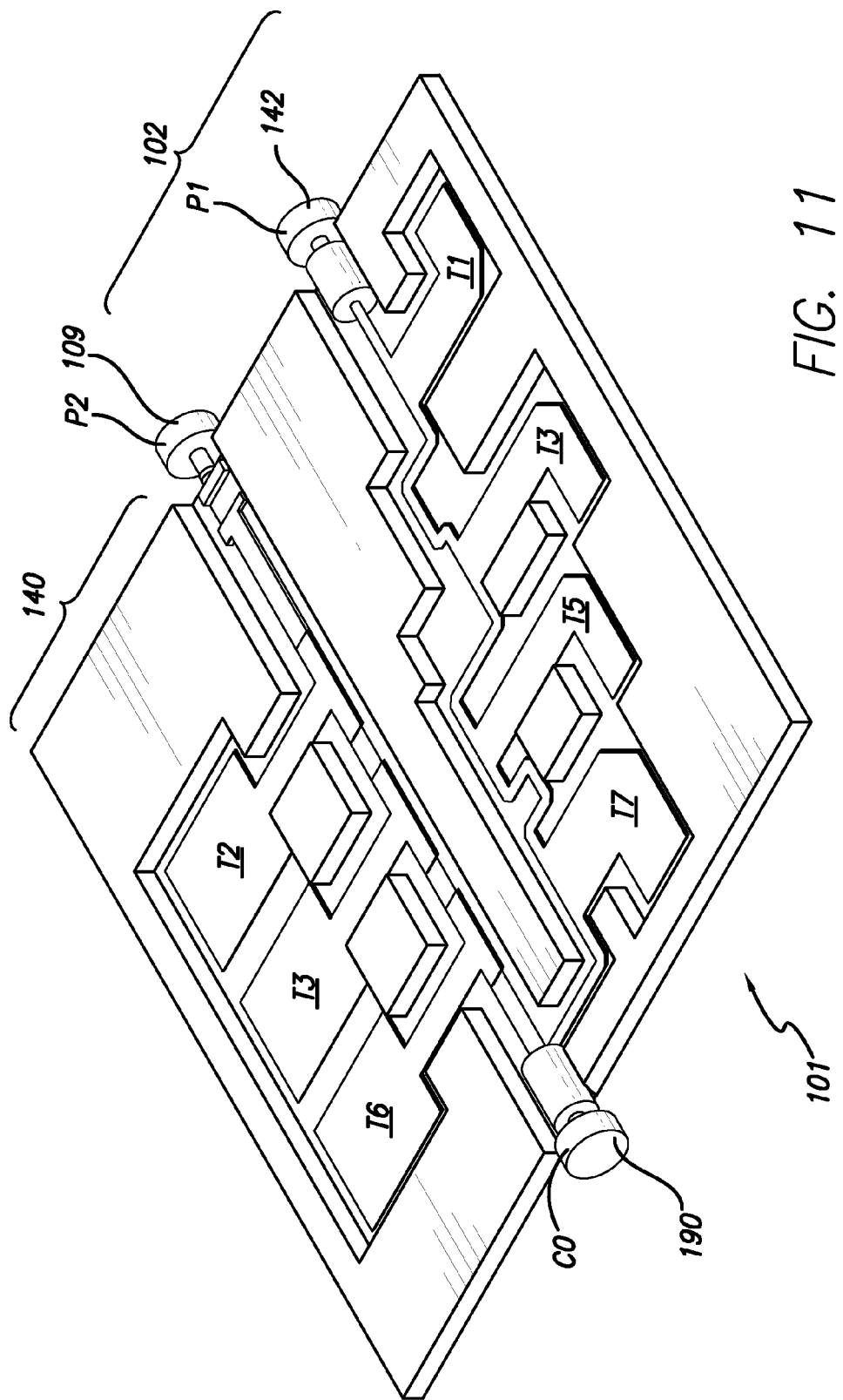
FIG. 11 is a perspective view of the diplexer circuit in an embodiment.

FIGS. 1 and 11 depict an exemplary diplexer in accordance with the invention. Although a diplexer is illustrated, additional low or high pass filter sections may be added and are implied such that each such disclosed filter section may be "one or more", forming a multiplexer in general. Diplexer 101 formed on a planar dielectric sheet 114 having a first surface 115 and a second surface 116, the second surface 116 on the opposite side of the sheet from first surface 115. In a preferred embodiment, the planar dielectric sheet 114 comprises a printed circuit board. A common bidirectional port 190 is formed on the dielectric sheet 114 which is coupled to a low pass filter section 102 and a high pass filter section 140. The ports may operate in one or two directions in general so are referred to herein as bidirectional ports, to indicate limitations on direction of signal flow is implied. The low pass filter section 102 has a low band bidirectional port 103 formed on the dielectric sheet 114 and one or more low pass conductive pathways such as pathways 104, 106, 108, 110, and 112. As used herein, the term "conductive pathway" and "transmission line" ("TL") or "strip-line" are used interchangeably and without any loss of generality or implied restriction on formation or structure of the conductive pathway. The low pass conductive pathway 104 is connected to the low band bidirectional port 103 and the low pass conductive pathway 112 is connected to the common bidirectional port 190. One or more low pass resonators such as strip-line resonators 120, 122, 124, and 126 are electrically coupled or shunted to the corresponding low pass conductive pathways 104, 106, 108, and 110. Supports such as risers 132, 138, 170, and 172 are formed surrounding the circuits and may support a top ground plane in one or more embodiments.

Still referring to FIGS. 1 and 11, high pass filter section 140 is shown. The high pass filter section 140 comprises a high pass band bidirectional port 142 formed on the dielectric sheet 114 with separate conductive pathways 144, 146, 148, 150, and 152 positioned between and interconnecting the high pass band bidirectional port 142 and the common bidirectional port 190. In one or more embodiments, the high pass filter section 140 may be employed without a low pass filter circuit to form a high pass filter in which case port 190 is not a common port. The conductive pathways together provide a 30 first and a second high pass band conductive pathway, each having separate sections or sets of pathways, together connecting ports 140 and 190. The first set of high pass band conductive pathways 144, 148, and 152 are formed on the first surface 115 of the dielectric sheet 114 where pathway 144 is connected to the high pass band bidirectional port 142 and pathway 152 is connected to the common bidirectional port 190.

The second set of high pass band conductive pathways 146 and 150 are formed on the second surface 116 of the dielectric such that pathway 146 is positioned opposite the gap in-between pathway 144 and pathway 148 on the opposite side 116 of the dielectric sheet 114. The pathway 150 is positioned in-between pathway 148 and pathway 152. The second set of high pass band conductive pathways 146 and 150 each has at least one portion that is overlapping and immediately opposite a corresponding portion of the first set of high pass band conductive pathways 144, 148, and 152. Each of the overlapping portions of the first and second set of high pass band conductive pathways are capacitively coupled as indicated by capacitors C1, C2, C3, and C4. In one or more embodiments, resonator 160 is formed on the second surface 116 and is electrically coupled to pathway 146, resonator 162 is formed on the first surface 115 and is electrically coupled to pathway 148, and resonator 164 is formed on the second surface 116 and is electrically coupled to pathway 150. These resonators may comprise open ended strip-lines, for example.

As illustrated in FIGS. 2 and 3, a diplexer 201 may comprise a planar dielectric sheet 202 placed between a first ground plane 210 and a second ground plane 212. The first ground plane 210 may be spaced away from the first surface 215 of the dielectric sheet and a second ground plane 212 may be spaced away from the second surface 216 of the dielectric sheet 202. In an embodiment, the planar dielectric sheet 202 comprises a suspended substrate. The first and second ground planes 210 and 212 may be part of a metal housing 208 which provides support of the dielectric sheet 202.

As discussed above, a portion of pathway 204 formed on the first surface 215 is immediately opposite and partially overlaps the pathway 206 formed on the second surface 216. The overlapping portions of pathways 204 and 206 are capacitively coupled and exhibit electrical properties of a capacitor. In one or more embodiments, although three high frequency resonators 160, 162, 164 are provided, the high pass filter circuit exhibits 9 to 11 transmission poles within the band of operation and may operate within the frequency range of approximately 1400 MHz to approximately 4000 MHz. The low pass filter circuit may operate within the frequency range of approximately 0 MHz to approximately 1200 MHz.

FIGS. 4, 4a, 4b, and 4c illustrate an equivalent circuit of a diplexer employing suspended substrate transmission lines and capacitors such as the diplexer 101 shown in FIG. 1 placed between ground planes 210 and 212 as shown in FIG. 3. Section 1 shows a low pass filter circuit interconnecting the common bidirectional port 391 (C0) and the low pass bidirectional port 345 (P1). Two 50 ohm terminals 386 and 388 shunts the low pass bidirectional port 345 and the common bidirectional port 391 (C0) to ground, respectively. The low pass bidirectional signal path comprises a plurality of low pass strip-lines such as transmission lines 338-358 connected in electrical series and one or more low pass resonators 379, 376, 374, and 360 connected in electrical shunt with adjacent low pass strip-lines. Sections 2 and 3 illustrate a high pass filter circuit comprising a high pass band bidirectional port 347 (P2) formed on the suspended substrate. A 50 ohm terminal 387 shunts the high pass bidirectional port 347 to ground. A bidirectional high pass band signal path interconnects the high pass band bidirectional port 347 and the common bidirectional port 391. The splitting of the high pass transmission line structure on two sides of the substrate creates a more complex resonance pattern in the circuit with additional resonances as discussed above and illustrated in the simulations discussed below. The bidirectional high pass band signal path effectively has a plurality of coupled strip-lines indicated as transmission lines 325-314 and capacitors 395, 396, 397, and 398 connected in electrical series between port C0 and P2. The resonators 320, 311, and 309 (T2, T4, and T6) are connected in electrical shunt with adjacent strip-lines.

Table I lists exemplary suspended substrate dimensions and parameters, Tables II and III list exemplary dimensions for low band and high band transmission lines, respectively, and Table IV lists exemplary equivalent capacitance. The dimensions, parameters, and components are provided as an example of one or more embodiments. However, it shall be understood that these are specific to the frequency bands and desired filter characteristics and other dimensions, parameters, and components are contemplated in one or more embodiments.

TABLE I

Suspended Substrate Dimensions and Parameters

| Parameter | Value |
|---|---|
| Substrate Thickness | 0.76 mm |
| Distance from Substrate to Ground planes | 2 mm |

TABLE I-continued

Suspended Substrate Dimensions and Parameters

| Parameter | Value |
|---|---|
| Conductor Thickness | 0.035 mm |
| Substrate Relative Dielectric Constant | 2.55 |

TABLE II

Low Band Suspended Substrate Lines

| Designator | Width (mm) | Length (mm) |
|---|---|---|
| 338 | 6.2 | 7.8 |
| 378 | 2.45 | 12.8 |
| 379 (T1) | 8.3 | 28.24 |
| 394 | 2.45 | 31.09 |
| 376 (T3) | 7.5 | 35.02 |
| 390 | 2.45 | 31.54 |
| 374 (T5) | 6.1 | 37.92 |
| 380 | 2.45 | 32.38 |
| 360 (T7) | 12 | 31.29 |
| 358 | 2.45 | 28.39 |

TABLE III

High Pass Band Suspended Substrate Lines

| | Width (mm) | Length (mm) |
|---|---|---|
| 325 | 5.416 | 7.76 |
| 322 | 2.93 | 9.975 |
| 323 | 3.05735 | 4.57 |
| 321 | 3.05735 | 4.57 |
| 317 | 2.93 | 6.69 |
| 316 | 2.93 | 6.359 |
| 319 | 3.72 | 22.014 |
| 320 (T2) | 17.776 | 16.98 |
| 318 | 3.05735 | 5.062 |
| 310 | 3.05735 | 5.062 |
| 314 | 2.93 | 10.65 |
| 312 | 4.803 | 21.421 |
| 311 (T4) | 17.94 | 16.3 |
| 315 | 2.93 | 9.53 |
| 313 | 3.05735 | 9.9735 |
| 306 | 3.05735 | 9.9735 |
| 305 | 2.93 | 9.566 |
| 308 | 3.294 | 20.806 |
| 309 (T6) | 14.44 | 23.98 |
| 304 | 2.93 | 7.459 |
| 303 | 3.05735 | 7.818 |
| 332 | 2.93 | 7.818 |
| 333 | 2.93 | 4.825 |
| 334 | 4.42 | 8.7 |

TABLE IV

Capacitor Values

| Capacitor | Value (pF) |
|---|---|
| 398 | 0.835 |
| 397 | 0.55 |
| 396 | 0.695 |
| 395 | 1.105 |

Figure 5:
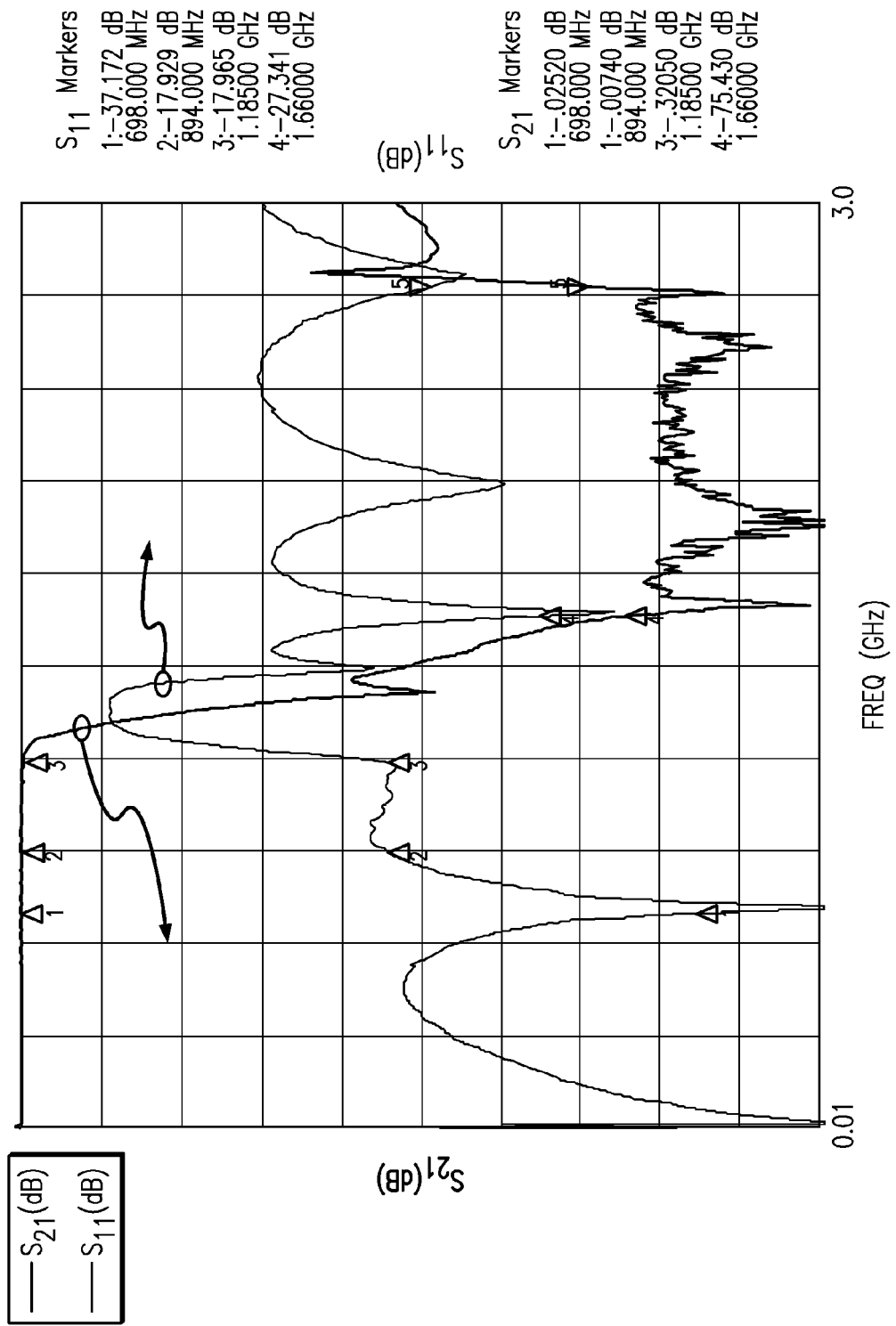
FIG. 5 depicts the measured low pass section response (P1 to C0).
Figure 6:
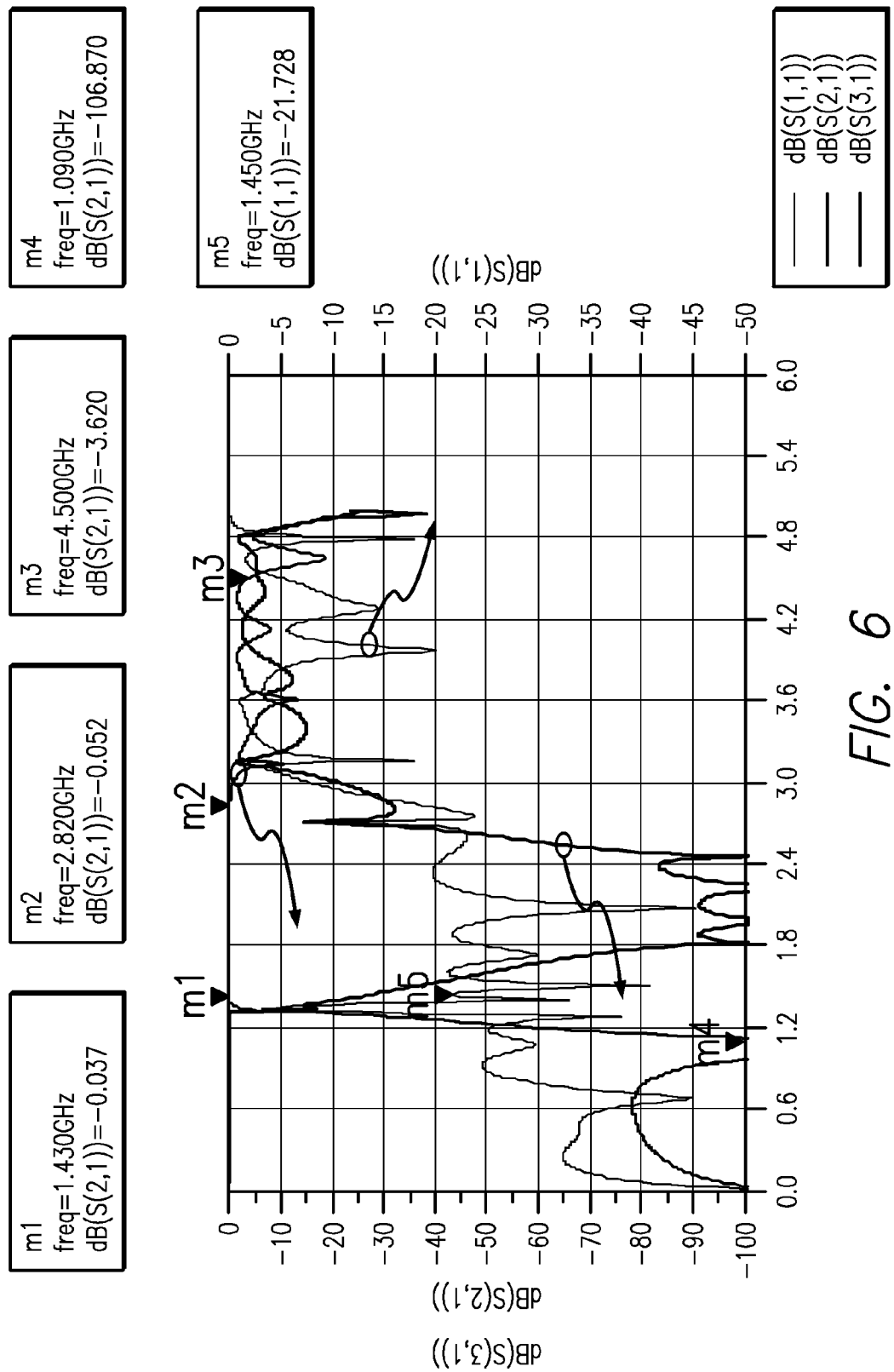
FIG. 6 is a simulation of the high pass filter section response (P2 to C0).

The above parameters were used for performing a computer simulation employing well known commercially available software (such as Agilent ADS). FIG. 5 depicts the measured low pass section response (P1 to C0) of an exemplary embodiment. The $S_{21}$ curve exhibits a generally flat frequency response with a cutoff frequency exceeding 1.18 GHz. FIG. 6 is a simulation of the high pass filter section response (P2 to C0). The $S_{21}$ curve exhibits a generally flat frequency band pass response between approximately 1.4 GHz and 2.8 GHz.

Figure 7:
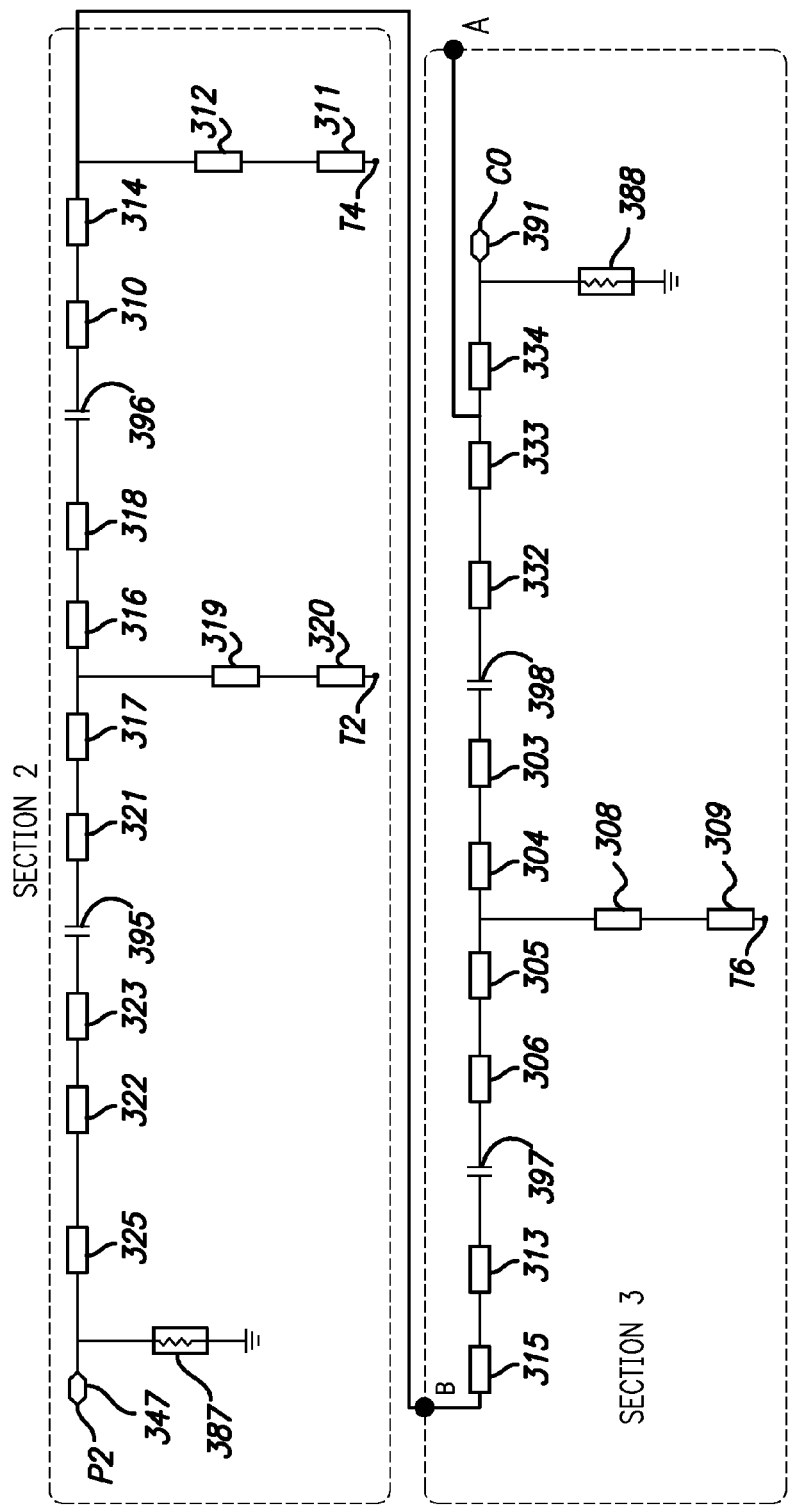
FIG. 7 illustrates an equivalent circuit of the high pass section where the low pass section is not shown (P2 to C0).
Figure 8:
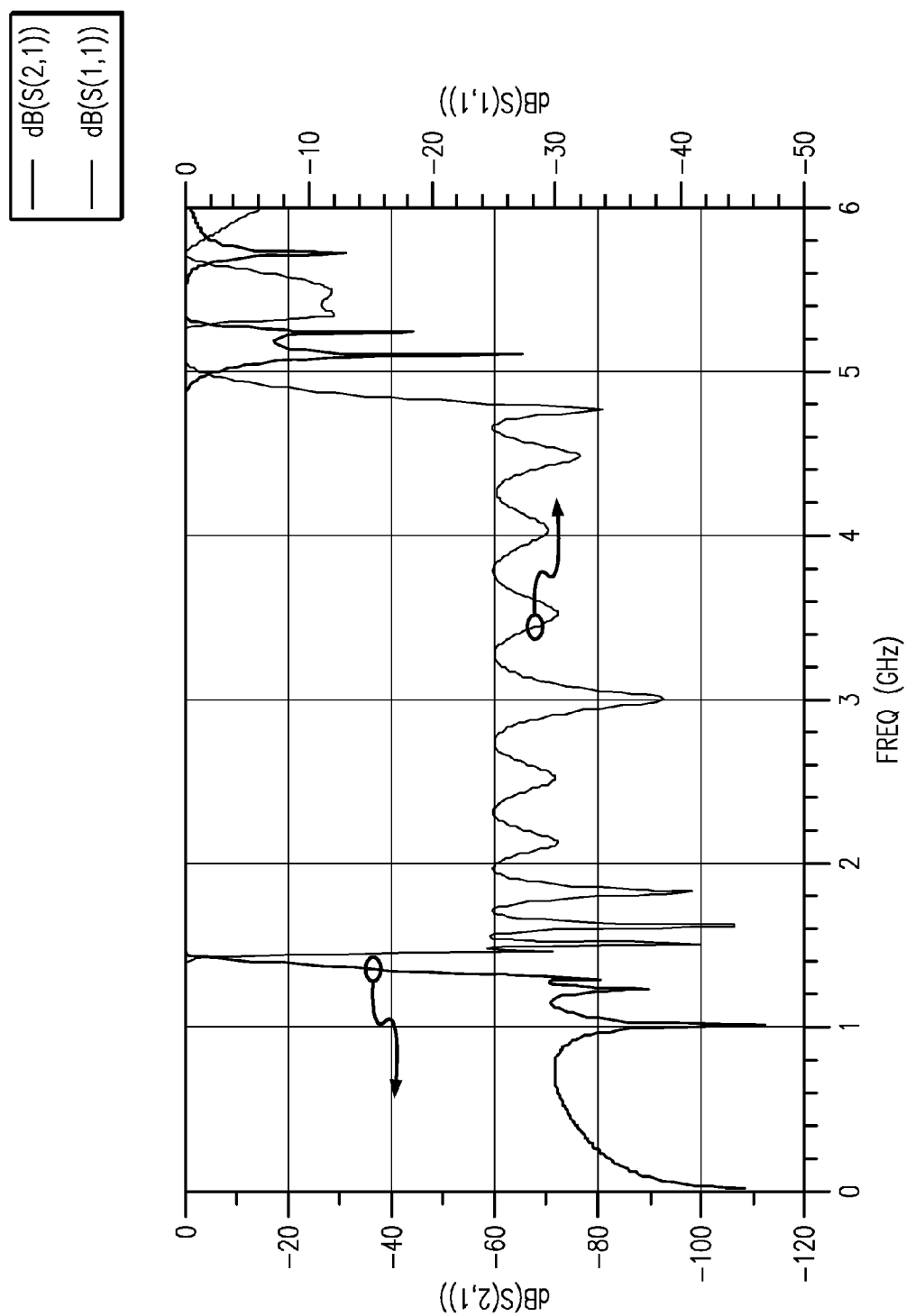
FIG. 8 illustrates the simulated high pass filter section response (P2 to C0).
Figure 9:
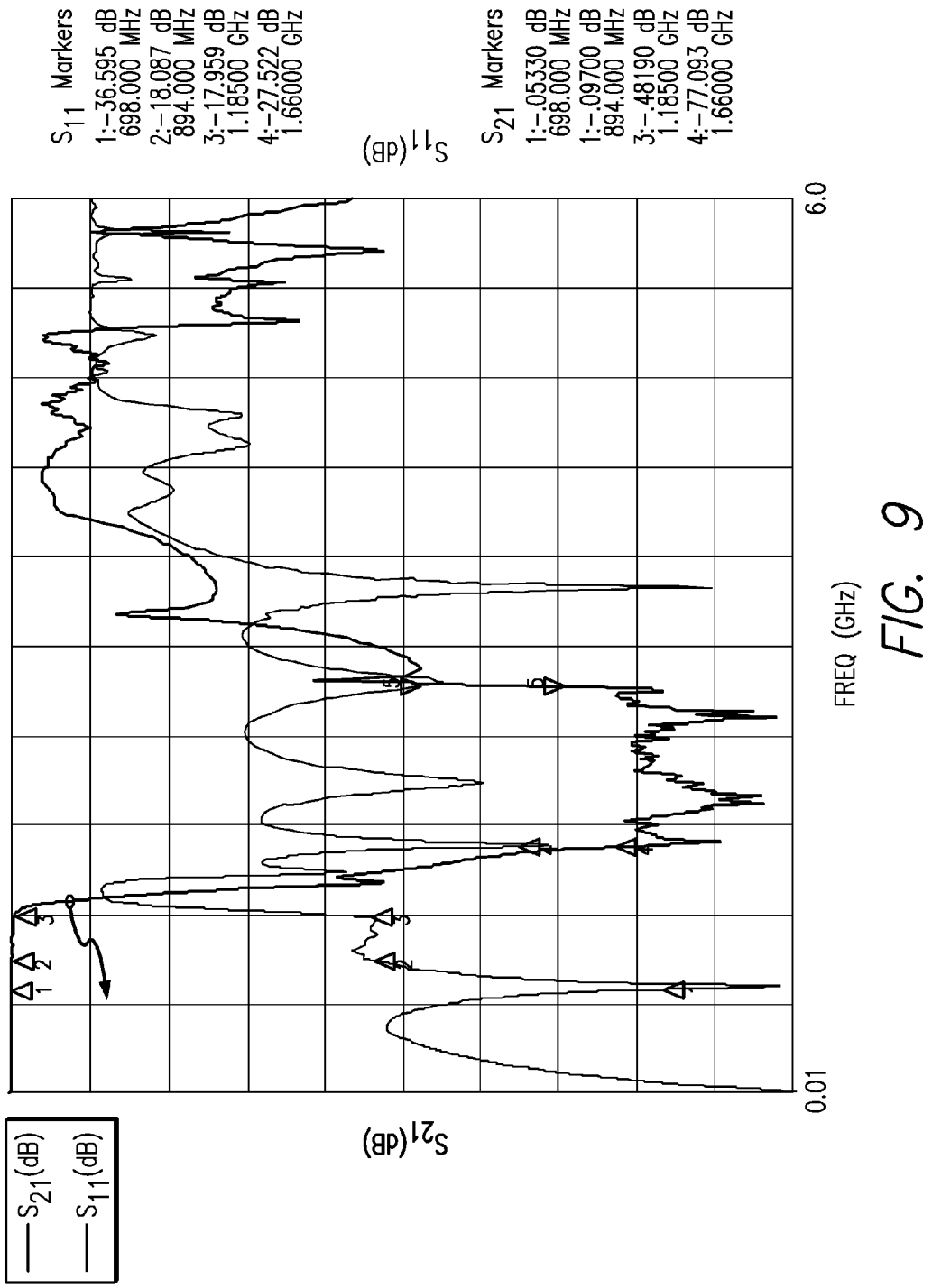
FIG. 9 depicts the measured Diplexer Low pass section (P1 to C0) for a wide frequency sweep of 10 MHz to 6 GHz.
Figure 10:
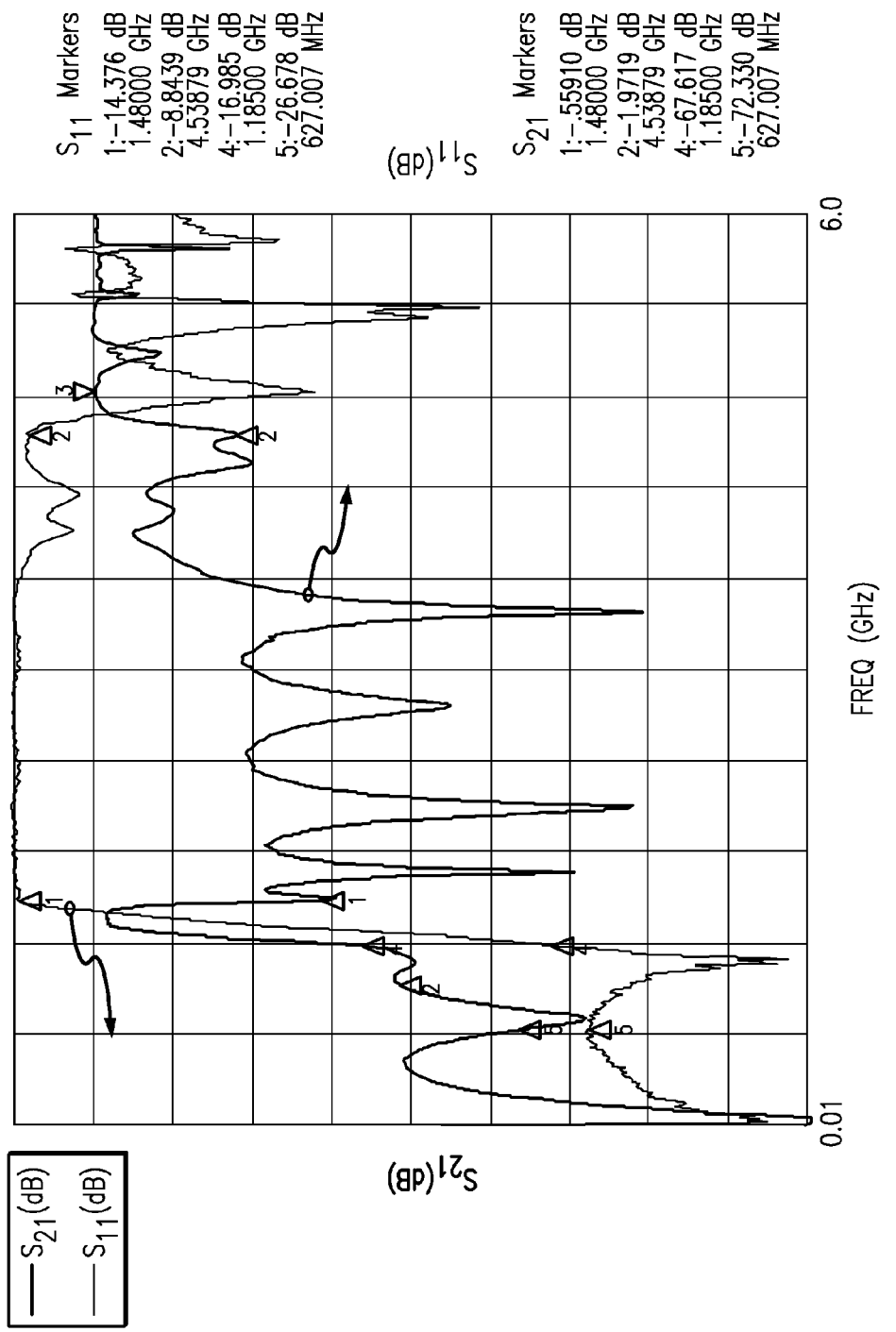
FIG. 10 depicts the measured Diplexer High Pass Section (P2 to C0) for a wide frequency sweep of 10 MHz to 6 GHz.

FIG. 7 illustrates an equivalent circuit of an embodiment of a high pass section where the low pass section is not shown (P2 to C0). FIG. 8 illustrates the simulated high pass filter section response (P2 to C0), where the $S_{21}$ curve exhibits a generally flat frequency band pass response between approximately 1.4 GHz and 5 GHz. FIG. 9 depicts the measured diplexer low pass section (P1 to C0) for a wide frequency sweep of 10 MHz to 6 GHz showing a cutoff frequency exceeding 1.18 GHz. FIG. 10 depicts the measured diplexer high pass section (P2 to C0) for a wide frequency sweep of 10 MHz to 6 GHz exhibiting a generally flat bandpass frequency response for a range between approximately 1.48 GHz to 4.5 GHz.

In one or more alternate embodiments, the additional resonances achieved by the split transmission line structure may be achieved without employing a suspended substrate transmission line. For example, a micro strip-line structure configured on one side of a printed circuit board with capacitive coupling between discrete strip-line segments may be employed. Discrete surface mount components may also create an effective multi-resonant transmission line structure.

The present invention has been described primarily as structures for broad band diplexers and high bandwidth pass band filters. The description is not intended to limit the invention to the form disclosed herein. Accordingly, variants and modifications consistent with the following teachings, skill, and knowledge of the relevant art, are within the scope of the present invention. The embodiments described herein are further intended to explain modes known for practicing the invention disclosed herewith and to enable others skilled in the art to utilize the invention in equivalent, or alternative embodiments and with various modifications considered necessary by the particular application(s) or use(s) of the present invention.

What is claimed is:

1. A diplexer, comprising:
   a top ground plate and a bottom ground plate spaced apart to form one or more cavities;
   at least one dielectric substrate suspended between the top and bottom ground plates;
   a common port coupled to the at least one substrate;
   a low frequency port coupled to the at least one substrate;
   a high frequency port coupled to the at least one substrate;
   a low pass filter section comprising a first transmission line structure, formed on the substrate and electrically connecting the low frequency port and the common port, and one or more low frequency resonator structures, each of the one or more low frequency resonator structures comprising a strip-line formed on a first surface of the substrate and coupled to the first transmission line structure; and
   a high pass filter section comprising a second transmission line structure formed on the first surface of the at least one substrate, and a third transmission line structure formed on a second surface of the substrate and having at least one portion overlapping and immediately opposite a corresponding portion of the second transmission line structure and capacitively coupled thereto, a fourth transmission line structure formed on the first surface and having at least one portion overlapping and immediately opposite a corresponding portion of the third transmission line structure and capacitively coupled thereto, the second, third, and fourth transmission line structures together electrically connecting the high frequency port and the common port, the high pass filter section further comprising one or more high frequency resonator structures formed on the substrate and coupled to at least one of the second and third transmission line structures;

wherein the one or more high frequency resonator structures comprise plural strip-line resonators alternating on the first and second sides of the at least one substrate; and wherein the plural resonators comprise:
- a first resonator comprising a first open ended strip-line formed on the second surface of the substrate, the first resonator electrically shunted to the third transmission line structure,
- a second resonator comprising a second open ended strip-line formed on the first surface of the substrate, the second resonator electrically shunted to the second transmission line structure; and,
- a third resonator comprising a third open ended strip-line formed on the surface, the third resonator electrically shunted to the fourth transmission line structure.

2. The diplexer of claim 1 wherein a low pass frequency range of the low pass filter section is within 20 MHz of a high pass frequency range of the high pass filter section.

3. The diplexer of claim 2 wherein the low pass frequency range of the low pass filter is 0 MHz to 806 MHz and the high pass frequency range of the high pass filter section is 824 MHz to 1200 MHz.

4. A diplexer as set out in claim 1, wherein the high pass filter section operates within a frequency range of approximately 1400 MHz to approximately 4000 MHz.

5. A diplexer as set out in claim 1, wherein the high pass filter section exhibits 9 to 11 transmission poles within a band of operation.

6. A diplexer as set out in claim 1, wherein the first transmission line structure is formed on the first side of the at least one substrate.

7. A diplexer as set out in claim 1, wherein the one or more low frequency resonator structures comprise four strip-line resonators.

8. A diplexer as set out in claim 7, wherein the low pass filter section operates within a frequency range of approximately 0 MHz to approximately 1200 MHz.

9. A diplexer as set out in claim 1, wherein the at least one dielectric substrate comprises a printed circuit board.

10. A multiplexer, comprising:
- a first ground plane;
- a second ground plane spaced away from and generally parallel with the first ground plane;
- a dielectric substrate having a first surface and a second surface, the substrate suspended between the first and second ground planes;
- a common port coupled to the suspended substrate;
- one or more low frequency ports;
- one or more low frequency filter structures interconnecting the common port and the one or more low frequency ports;
- one or more high frequency filter structures, each comprising:
  - a high frequency port coupled to the suspended substrate;
  - a first split conductive path having gaps therein and partially physically interconnecting the high frequency port and the common port and formed on the first surface of the suspended substrate;
  - a second split conductive path having gaps therein formed on the second surface of the suspended substrate, wherein the second conductive path overlaps the gaps in the first conductive path and overlaps and is capacitively coupled to the first conductive path at portions adjacent the gaps; and,
  - one or more high frequency resonators formed on the substrate and in electrical shunt with an adjacent conductive path;

wherein said one or more resonator structures comprise:
  - a first strip-line resonator comprising a first open ended strip-line formed on the second surface of the substrate, the first strip-line resonator electrically shunted to a first portion of the second conductive pathway;
  - a second strip-line resonator comprising a second open ended strip-line formed on the first surface of the substrate, the second strip-line resonator electrically shunted to a first portion of the first split conductive pathway, wherein the first portion of the second split conductive pathway is capacitively coupled to the first portion of the first split conductive pathway; and,
  - a third strip-line resonator comprising a third open ended strip-line formed on the second surface of the substrate, the third strip-line resonator electrically shunted to a second portion of the second split conductive pathway, wherein the second portion of the second split conductive pathway is capacitively coupled to the first portion of the first split conductive pathway.

11. A multiplexer as set out in claim 10, wherein each low frequency filter structure comprises a low frequency signal path interconnecting the low frequency port and the common port and one or more low frequency strip-line resonators connected in electrical shunt with the low frequency signal path.

12. A wideband filter, comprising:
- a dielectric substrate having a first surface and a second surface;
- a first port coupled to the dielectric substrate;
- a second port coupled to the dielectric substrate, and,
- a first conductive pathway having plural separate sections formed on the first surface of the substrate between the first and second ports, the first port electrically coupled to a section of the first conductive pathway nearest the first port, the second port electrically coupled to the section of the first conductive pathway nearest the second port, the plural separate sections comprising at least a first transmission line structure;
- a second conductive pathway having one or more separate sections formed on the second surface of the dielectric substrate, the second conductive pathway having at least one portion overlapping and immediately opposite a corresponding gap in the sections of the first conductive pathway, and overlapping adjacent portions of the first conductive pathway and capacitively coupled thereto, the one or more separate sections comprising at least a second transmission line structure and a third transmission line structure; and
- one or more resonator structures formed on the substrate and coupled to at least one of the first and second conductive pathways, each of the one or more low frequency resonator structures comprising a strip-line;

wherein said one or more resonator structures comprise:
a first strip-line resonator comprising a first open ended strip-line formed on the second surface of the substrate, the first strip-line resonator electrically shunted to the second transmission line structure of the second conductive pathway;
a second strip-line resonator comprising a second open ended strip-line formed on the first surface of the substrate, the second strip-line resonator electrically shunted to the first transmission line structure of the first conductive pathway; and,
a third strip-line resonator comprising a third open ended strip-line formed on the second surface of the substrate, the third transmission line structure of the third strip-line resonator electrically shunted to the second conductive pathway.

13. A wideband filter as set out in claim 12, further comprising a metal housing enclosing the dielectric substrate, the metal housing having a first ground plane spaced away from the first surface of the substrate, the metal housing having a second ground plane spaced away from the second surface of the substrate, wherein the substrate is suspended between the first and second ground planes.

14. A wideband filter as set out in claim 12, wherein the plurality of separate sections of the first conductive pathway comprises at least four separate sections and two gaps, and the one or more separate sections of the second conductive pathway comprises at least two separate sections overlapping the two gaps and adjacent portions of the first conductive pathway.

15. A wideband filter as set out in claim 12, wherein said filter exhibits more transmission poles within a band of operation than the number of resonators.

16. A wideband filter as set out in claim 15, wherein the filter exhibits 9 to 11 transmission poles within the band of operation.

17. A wideband filter as set out in claim 16, wherein the filter operates within a frequency range of approximately 1400 MHz to approximately 4000 MHz.

18. A wideband filter as set out in claim 12, wherein the dielectric substrate comprises a printed circuit board.

* * * * *